US012557448B2

(12) United States Patent
Aas

(10) Patent No.: US 12,557,448 B2
(45) Date of Patent: Feb. 17, 2026

(54) COLOR TUNABLE pcLEDs BASED ON TEMPORAL SATURATION OF PHOSPHORS

(71) Applicant: LUMILEDS LLC, San Jose, CA (US)

(72) Inventor: Mehdi Aas, Eindhoven (NL)

(73) Assignee: LUMILEDS SINGAPORE PTE. LTD., Singapore (SG)

(*) Notice: Subject to any disclaimer, the term of this patent is extended or adjusted under 35 U.S.C. 154(b) by 565 days.

(21) Appl. No.: 17/990,012

(22) Filed: Nov. 18, 2022

(65) Prior Publication Data

US 2023/0187590 A1 Jun. 15, 2023

Related U.S. Application Data

(60) Provisional application No. 63/289,445, filed on Dec. 14, 2021.

(51) Int. Cl.
*H10H 20/851* (2025.01)
*H01L 25/075* (2006.01)

(52) U.S. Cl.
CPC ..... *H10H 20/8513* (2025.01); *H01L 25/0753* (2013.01)

(58) Field of Classification Search
None
See application file for complete search history.

(56) References Cited

U.S. PATENT DOCUMENTS

| | | | |
|---|---|---|---|
| 2006/0114201 A1* | 6/2006 | Chang | H05B 45/22 345/83 |
| 2007/0159066 A1 | 7/2007 | Cheetham et al. | |
| 2009/0189507 A1 | 7/2009 | Winkler et al. | |
| 2013/0214673 A1 | 8/2013 | Duan et al. | |
| 2016/0308097 A1* | 10/2016 | Horie | C09K 11/7769 |
| 2020/0152034 A1 | 5/2020 | Duric et al. | |
| 2022/0198995 A1* | 6/2022 | Ahmed | H10D 30/6755 |

FOREIGN PATENT DOCUMENTS

| | | |
|---|---|---|
| KR | 10-1223943 B1 | 1/2013 |
| WO | 2007/020556 A1 | 2/2007 |

OTHER PUBLICATIONS

Notification of the Transmittal of the International Search Report and the Written Opinion from KIPO as the ISA corresponding to PCT/US2022/050378, Mar. 24, 2023, 12 pages.
The extended European search report, 22908202.9, Nov. 19, 2025, 10 pages.

* cited by examiner

*Primary Examiner* — Sarah K Salerno

(57) ABSTRACT

Phosphor converted LEDs (pcLEDs) are color tuned by temporal saturation of an electronic transition from which the phosphor emission arises. A single such pcLED is individually color tunable. In an array of such pcLEDs each pixel may be separately color tunable.

20 Claims, 11 Drawing Sheets

COLOR TUNABLE pcLEDs BASED ON TEMPORAL SATURATION OF PHOSPHORS

CROSS-REFERENCE TO RELATED APPLICATIONS

This application claims benefit of priority to U.S. Provisional Patent Application No. 63/289,445 filed Dec. 14, 2021, which is incorporated herein by reference in its entirety.

FIELD OF THE INVENTION

The invention relates generally to pcLEDs, pcLED arrays, light sources comprising pcLEDs or pcLED arrays, and displays comprising pcLED arrays.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer. Phosphor-converted LEDs may be designed so that all the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Technological and business applications of pcLEDs include use in displays, matrices and light engines including automotive adaptive headlights, augmented-reality (AR) displays, virtual-reality (VR) displays, mixed-reality (MR) displays (AR, VR, and MR systems referred to herein as visualization systems), smart glasses and displays for mobile phones, smart watches, monitors and TVs, and flash illumination for cameras in mobile phones.

Phosphor converted LEDs are widely used in illumination and projection applications. Illumination and projection with pcLEDs have several advantages over other projection light sources, for example high brightness, high contrast, low power consumption, and lower cost. Projection of light can be for projecting specific shapes (e.g., information) or for projecting a precise illumination beam, for example to cover a target shape. In this way light and hence energy can be saved by avoiding wastage of light outside the target area.

Projection systems using pcLEDs generally comprise an array of pcLEDs and an optic or optical system that images the array into the optical far field to provide a projection beam of light. Color tunable pcLED illumination and projection systems conventionally comprise groups of two or more pcLEDs, each designed to emit a different color of light, arranged adjacent to each other in the pcLED array. The individual pcLEDs of different color in a group can be operated at different intensities so that the mixed emission from the group can be tuned to a desired color. For the emission from the different color pcLEDs in a group to be well mixed in the far field beam output from the projection system, the size and spacing of the pcLEDs in the array should be smaller than the spatial resolution of the projection optic or optical system. This may be unfeasible with projection optics and optical systems having high spatial resolution.

SUMMARY

This specification discloses color tunable pcLEDs for which the output light beam is color tuned by temporal saturation of an electronic transition from which the phosphor light emission arises. A single such pcLED is individually color tunable. In an array of such pcLEDs each pixel may be separately color tunable. Consequently, a projected beam from such an array will not show undesirable spatial color variation, in contrast to conventional devices as described above in which color tuning is accomplished using spatially separated pcLEDs that emit different colors of light.

In one aspect of the invention, a light emitting device comprises a semiconductor light emitting diode configured to emit a train of primary light pluses with each primary light pulse having a maximum amplitude and a temporal full width at half maximum, and with adjacent light pulses in the train separated in time from each other by a temporal pulse spacing. A phosphor material is arranged in an optical path for light emitted by the semiconductor light emitting diode. The phosphor material is characterized by having an electronic transition that absorbs primary light emitted by the semiconductor light emitting diode and by emitting secondary light of a longer wavelength in response to absorbing the primary light. The phosphor material electronic transition is characterized by a relaxation time.

The light emitting device comprises a controller configured to drive the semiconductor light emitting diode to emit the train of primary light pulses with, for at least some of the light pulses, their temporal full width at half maximum less than the phosphor material electronic transition relaxation time and with a combination of temporal full width at half maximum and maximum amplitude that saturates the phosphor material electronic transition.

The light pulse temporal full width at half maximum may be, for example, less than or equal to 30 nanoseconds, less than or equal to 20 nanoseconds, less than or equal to 10 nanoseconds, or less than or equal to 5 nanoseconds.

The controller may be configured to adjust the temporal full width at half maximum, the maximum amplitude, the temporal pulse spacing, or any combination thereof to adjust an amount of primary light transmitted unabsorbed through the phosphor material.

The light emitting device may emit white light characterized by a correlated color temperature, in which case the controller may be configured to adjust the temporal full width at half maximum, the maximum amplitude, the temporal pulse spacing, or any combination thereof to adjust the correlated color temperature by adjusting an amount of primary light transmitted unabsorbed through the phosphor material.

The light emitting device may emit light characterized by a color point x, y in a CIE 1931 chromaticity diagram, in which case the controller may be configured to adjust the temporal full width at half maximum, the maximum amplitude, the temporal pulse spacing, or any combination thereof to adjust the color point by adjusting an amount of primary light transmitted unabsorbed through the phosphor material.

The primary light emitted by the LED may be blue light, for example.

The phosphor material electronic transition relaxation time may be, for example, less than or equal to 10 milliseconds, less than or equal to 1 millisecond, or less than or equal to 0.1 millisecond.

The phosphor material may be or comprise, for example, YAG:$Ce^{3+}$, CASN:$Eu^{2+}$, or KSF:$Mn^{4+}$, or any mixture thereof.

In one variation the primary light is blue light, the phosphor material is YAG:$Ce^{3+}$; and the controller is configured to adjust the temporal full width at half maximum, the maximum amplitude, the temporal pulse spacing, or any combination thereof to adjust correlated color temperature between 3950K and 6070K.

In another aspect of the invention an illumination system comprises a plurality of any of the light emitting devices described above arranged in an array, and an optic or optical system arranged to image the array to form an output illumination beam. In this illumination system, some or all the light emitting devices may be independently operable to steer a direction of the output illumination beam.

In another aspect of the invention a display system comprises a light source comprising a plurality any of the light emitting devices described above arranged in an array, a display, and an optic or optical system arranged to couple light from the light source into the display.

In another aspect of the invention a mobile device comprises a camera, a flash illumination system, and a controller. The flash illumination system comprises a light source comprising a plurality of any of the light emitting devices described above arranged in an array and an optic or optical system arranged to at least partially collimate light emitted by the light source. The controller is configured to operate the light emitting devices. The controller may operate the light emitting devices to match a field of view of the flash illumination system to a field of view of the camera.

Another aspect of the invention is a method of operating a light emitting device. The light emitting device comprises a semiconductor light emitting diode configured to emit a train of primary light pluses, each primary light pulse having a maximum amplitude and a temporal full width at half maximum amplitude, adjacent light pulses in the train separated in time from each other by a temporal pulse spacing, and a phosphor material arranged in an optical path for light emitted by the semiconductor light emitting diode and characterized by having an electronic transition that absorbs primary light emitted by the semiconductor light emitting diode and by emitting secondary light of a longer wavelength in response to absorbing the blue light, the phosphor material electronic transition characterized by a relaxation time.

The method comprises driving the semiconductor light emitting diode to emit the train of primary light pulses with, for at least some of the pulses, their temporal full width at half maximum less than the phosphor material electronic transition relaxation time and with a combination of temporal full width at half maximum, maximum amplitude, temporal pulse spacing, or any combination thereof selected to adjust primary light transmitted unabsorbed through the phosphor material to a desired amount.

In this method the light emitting device may emit an output beam of white light characterized by a correlated color temperature, and the method may comprise driving the semiconductor light emitting diode to emit the train of primary light pulses with a combination of temporal full width at half maximum, maximum amplitude, temporal pulse spacing, or any combination thereof selected to adjust the correlated color temperature to a desired value.

In this method the light emitting device may emit an output beam of light characterized by a color point x,y in a CIE 1931 chromaticity diagram, and the method may comprise driving the semiconductor light emitting diode to emit the train of primary light pulses with a combination of temporal full width at half maximum, maximum amplitude, temporal pulse spacing, or any combination thereof selected to adjust the color point to a desired value.

These and other embodiments, features and advantages of the present invention will become more apparent to those skilled in the art when taken with reference to the following more detailed description of the invention in conjunction with the accompanying drawings that are first briefly described

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
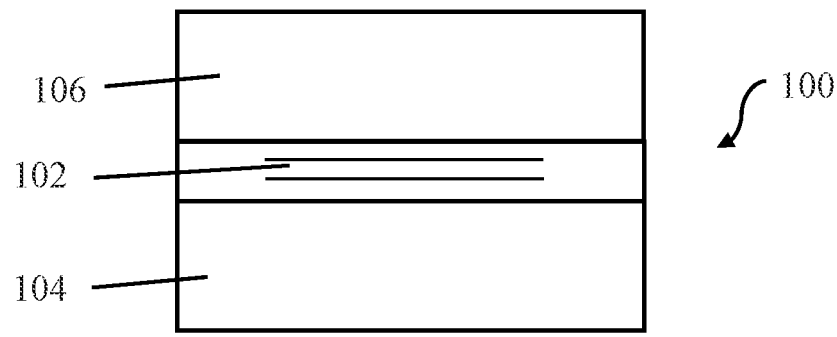
FIG. 1 shows a schematic cross-sectional view of an example pcLED.

FIG. 1 shows an example of an individual pcLED 100 comprising a light emitting semiconductor diode (LED) structure 102 disposed on a substrate 104, and a phosphor layer 106 (which may also be referred to herein as a wavelength converting structure) disposed on the LED. Light emitting semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits ultraviolet, blue, green, or red light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output and color specifications from the pcLED. Phosphor layers may for example comprise phosphor particles dispersed in or bound to each other with a binder material or be or comprise a sintered ceramic phosphor plate.

Figure 2A:
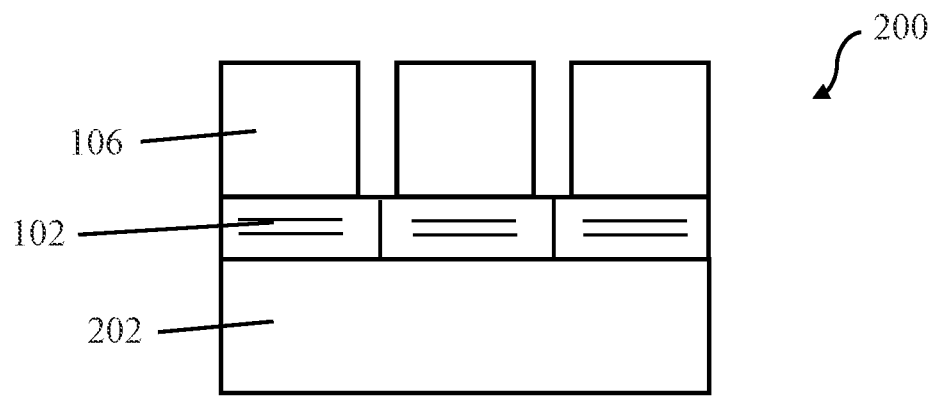
FIGS. 2A and 2B show, respectively, cross-sectional and top schematic views of an array of pcLEDs.
Figure 2B:
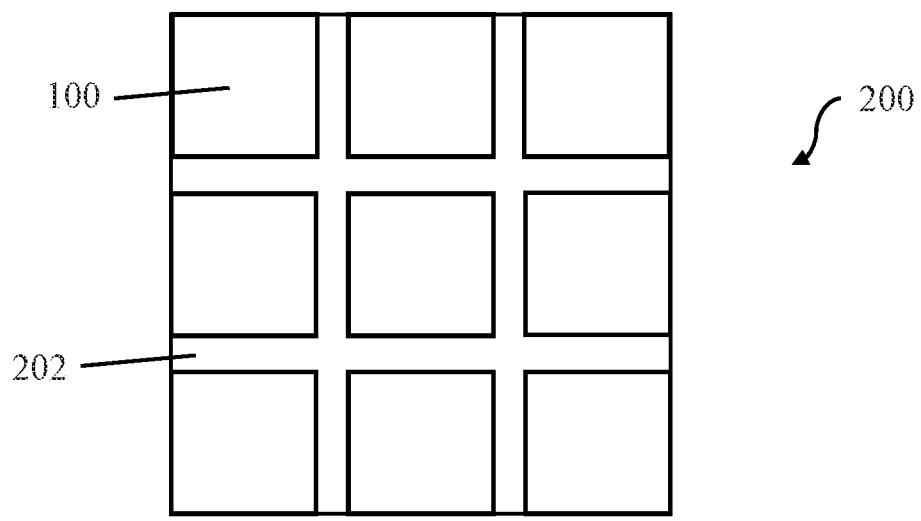

FIGS. 2A-2B show, respectively, cross-sectional and top views of an array 200 of pcLEDs 100 including phosphor layers 106 disposed on a substrate 202. Such an array may include any suitable number of pcLEDs arranged in any suitable manner. In the illustrated example the array is depicted as formed monolithically on a shared substrate, but alternatively an array of LEDs or pcLEDs may be formed from individual mechanically separate LEDs or pcLEDs. Substrate 202 may optionally comprise CMOS circuitry for driving the LEDs and may be formed from any suitable materials.

Although FIGS. 2A-2B show a three-by-three array of nine pcLEDs, such arrays may include for example tens, hundreds, or thousands of LEDs or pcLEDs. Individual LEDs or pcLEDs may have widths (e.g., side lengths) in the plane of the array of, for example, less than or equal to 1 millimeter (mm), less than or equal to 500 microns, less than or equal to 100 microns, less than or equal to 50 microns, or less than or equal to 10 microns. LEDs in such an array may be spaced apart from each other by streets or lanes having a width in the plane of the array of, for example, hundreds of microns, less than or equal to 100 microns, less than or equal to 50 microns, less than or equal to 10 microns, or less than or equal to 5 microns. Although the illustrated examples show rectangular LEDs or pcLEDs arranged in a symmetric matrix, the LEDs or pcLEDs and the array may be of any suitable shape or arrangement and need not all be of the same shape or size. For example, LEDs or pcLEDs located in central portions of an array may be larger than those located in peripheral portions of the array. Alternatively, LEDs or pcLEDs located in central portions of an array may be smaller than those located in peripheral portions of the array.

Figure 2C:
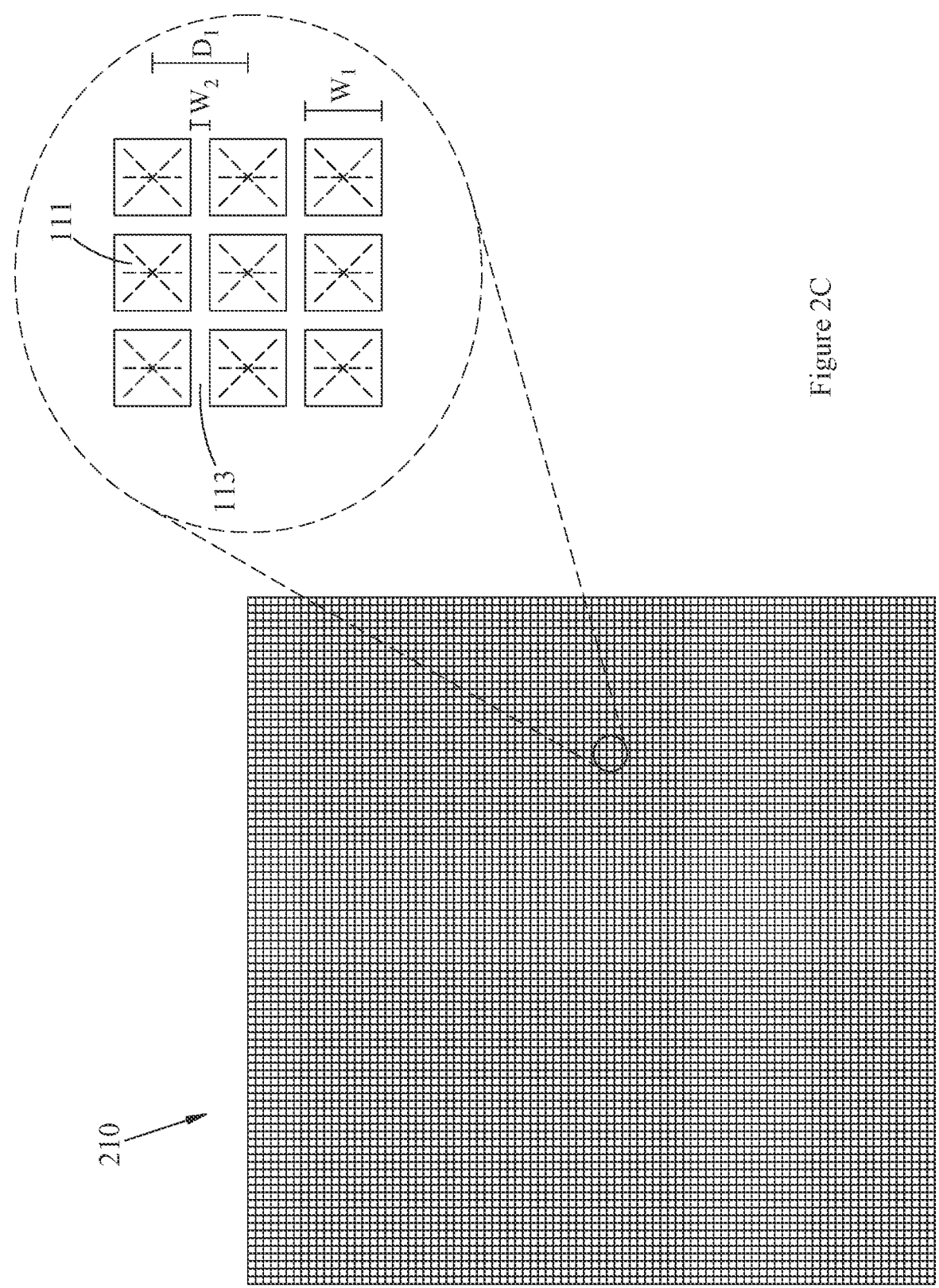
FIG. 2C shows a schematic top view of an LED wafer from which LED arrays such as those illustrated in FIGS. 2A and 2B may be formed.

FIG. 2C shows a schematic top view of a portion of an LED wafer 210 from which LED arrays such as those illustrated in FIGS. 2A and 2B may be formed. FIG. 2C also shows an enlarged 3×3 portion of the wafer. In the example wafer individual LEDs or pcLEDs 111 having side lengths (e.g., widths) of $W_1$ are arranged as a square matrix with neighboring LEDs or pcLEDs having a center-to-center distances $D_1$ and separated by lanes 113 having a width $W_2$. $W_1$ may be, for example, less than or equal to 1 millimeter (mm), less than or equal to 500 microns, less than or equal to 100 microns, less than or equal to 50 microns, or less than or equal to 10 microns. $W_2$ may be, for example, hundreds of microns, less than or equal to 100 microns, less than or equal to 50 microns, less than or equal to 10 microns, or less than or equal to 5 microns. $D_1=W_1+W_2$.

An array may be formed, for example, by dicing wafer 210 into individual LEDs or pcLEDs and arranging the dice on a substrate. Alternatively, an array may be formed from the entire wafer 210, or by dividing wafer 210 into smaller arrays of LEDs or pcLEDs.

LEDs or pcLEDs having dimensions in the plane of the array (e.g., side lengths) of less than or equal to about 50 microns are typically referred to as microLEDs, and an array of such microLEDs may be referred to as a microLED array.

In an array of pcLEDs, all pcLEDs may be configured to emit essentially the same spectrum of light. Alternatively, a pcLED array may be a multicolor array in which different pcLEDs in the array may be configured to emit different spectrums (colors) of light by employing different phosphor compositions. Similarly, in an array of direct emitting LEDs (i.e., not wavelength converted by phosphors) all LEDs in the array may be configured to emit essentially the same spectrum of light, or the array may be a multicolor array comprising LEDs configured to emit different colors of light.

The individual LEDs or pcLEDs in an array may be individually operable (addressable) and/or may be operable as part of a group or subset of (e.g., adjacent) LEDs or pcLEDs in the array.

An array of LEDs or pcLEDs, or portions of such an array, may be formed as a segmented monolithic structure in which individual LEDs or pcLEDs are electrically isolated or partially electrically isolated from each other by trenches and/or insulating material, but the electrically isolated or partially electrically isolated segments remain physically connected to each other by other portions of the semiconductor structure. For example, in such a monolithic structure the active region and a first semiconductor layer of a first conductivity type (n or p) on one side of the active region may be segmented, and a second unsegmented semiconductor layer of the opposite conductivity type (p or n) positioned on the opposite side of the active region from the first semiconductor layer. The second semiconductor layer may then physically and electrically connect the segmented structures to each other on one side of the active region, with the segmented structures otherwise electrically isolated from each other and thus separately operable as individual LEDs.

An LED or pcLED array may therefore be or comprise a monolithic multicolor matrix of individually operable LED or pcLED light emitters. The LEDs or pcLEDs in the monolithic array may for example be microLEDs as described above.

A single individually operable LED or pcLED or a group of adjacent such LEDs or pcLEDs may correspond to a single pixel (picture element) in a display. For example, a group of three individually operable adjacent LEDs or pcLEDs comprising a red emitter, a blue emitter, and a green emitter may correspond to a single color-tunable pixel in a display.

Figure 3A:
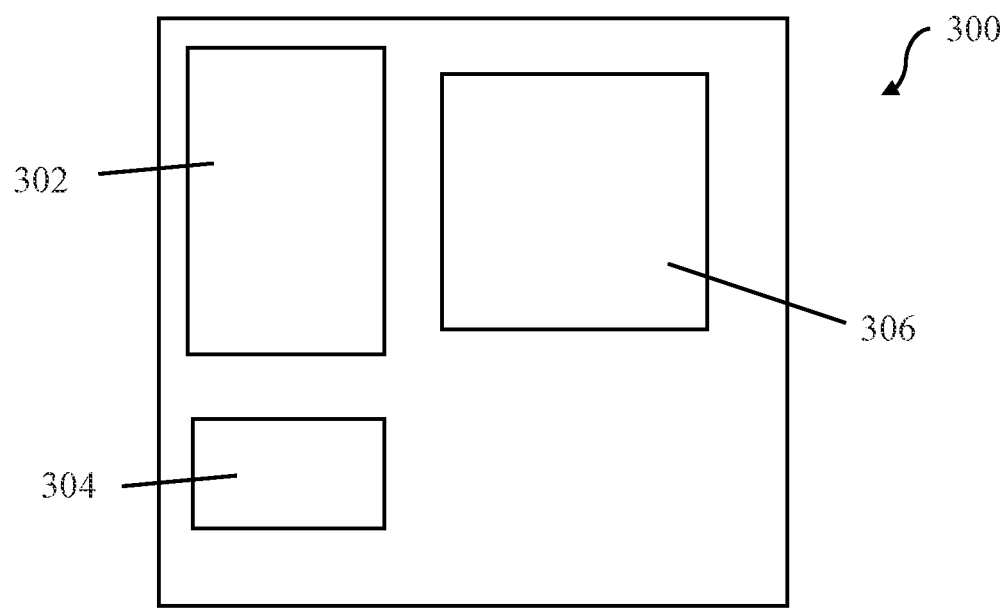
FIG. 3A shows a schematic top view of an electronics board on which an array of pcLEDs may be mounted, and FIG. 3B similarly shows an array of pcLEDs mounted on the electronic board of FIG. 3A.
Figure 3B:
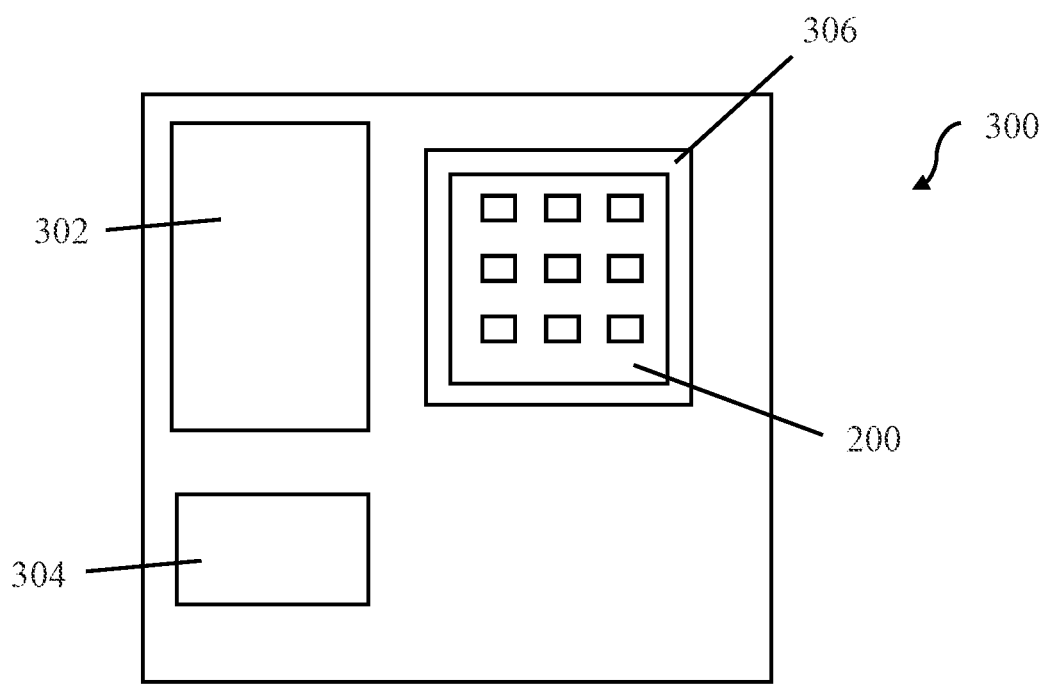

As shown in FIGS. 3A-3B, an LED or pcLED array 200 may for example be mounted on an electronics board 300 comprising a power and control module 302, a sensor module 304, and an attach region 306. Power and control module 302 may receive power and control signals from external sources and signals from sensor module 304, based on which power and control module 302 controls operation of the LEDs/pcLEDs. Sensor module 304 may receive signals from any suitable sensors, for example from temperature or light sensors. Alternatively, array 200 may be mounted on a separate board (not shown) from the power and control module and the sensor module.

Figure 4A:
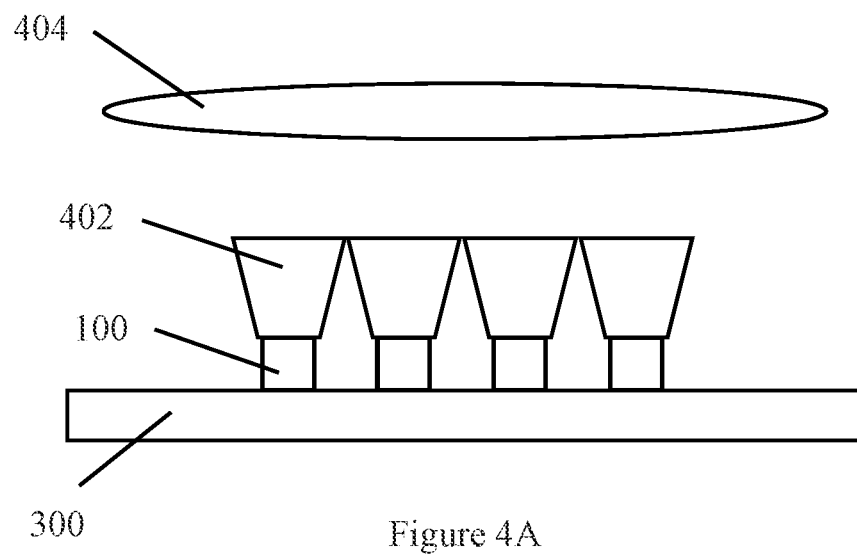
FIG. 4A shows a schematic cross-sectional view of an array of pcLEDs arranged with respect to waveguides and a projection lens.
Figure 4B:
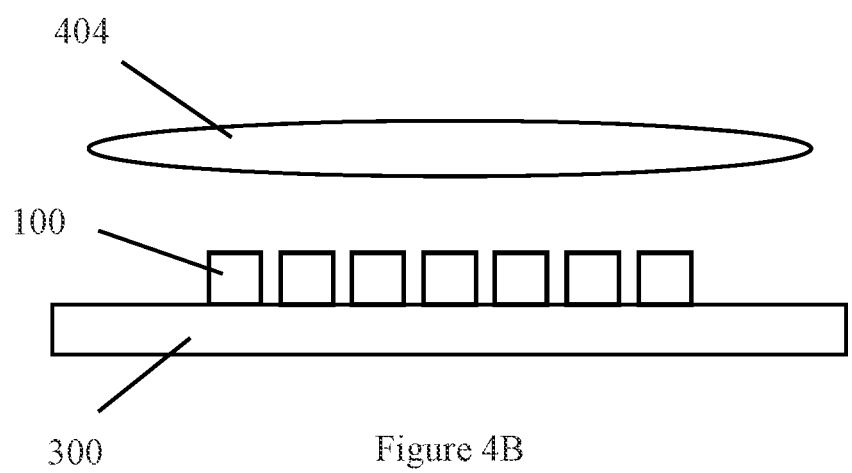
FIG. 4B shows an arrangement similar to that of FIG. 4A, without the waveguides.

Individual LEDs or pcLEDs may optionally incorporate or be arranged in combination with a lens or other optical element located adjacent to or disposed on the LED or the phosphor layer of the pcLED. Such an optical element, not shown in the figures, may be referred to as a "primary optical element". In addition, as shown in FIGS. 4A-4B an array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may be particularly suitable when LEDs or pcLEDs can be spaced sufficiently close to each other and may also be used in automobile headlights as well as in camera flash applications. A microLED display application may use similar optical arrangements to those depicted in FIGS. 4A-4B, for example.

In another example arrangement, a central block of LEDs or pcLEDs in an array may be associated with a single common (shared) optic, and edge LEDs or pcLEDs located in the array at the periphery of the central bloc are each associated with a corresponding individual optic.

Generally, any suitable arrangement of optical elements may be used in combination with the LED and pcLED arrays described herein, depending on the desired application.

LED and pcLED arrays as described herein may be useful for applications requiring or benefiting from fine-grained intensity, spatial, and temporal control of light distributions. These applications may include, but are not limited to, precise special patterning of emitted light from individual LEDs or pcLEDs or from groups (e.g., blocks) of LEDs or pcLEDs. Depending on the application, emitted light may be spectrally distinct, adaptive over time, and/or environmentally responsive. Such arrays may provide pre-programmed light distribution in various intensity, spatial, or temporal patterns. The emitted light may be based at least in part on received sensor data and may be used for optical wireless communications. Associated electronics and optics may be distinct at an individual LED/pcLED, group, or device level.

An array of independently operable LEDs or pcLEDs may be used in combination with a lens, lens system, or other optic or optical system (e.g., as described above) to provide illumination that is adaptable for a particular purpose. For example, in operation such an adaptive lighting system may provide illumination that varies by color and/or intensity across an illuminated scene or object and/or is aimed in a desired direction. Beam focus or steering of light emitted by the LED or pcLED array can be performed electronically by activating LEDs or pcLEDs in groups of varying size or in sequence, to permit dynamic adjustment of the beam shape and/or direction without moving optics or changing the focus of the lens in the lighting apparatus. A controller can be configured to receive data indicating locations and color characteristics of objects or persons in a scene and based on that information control LEDs or pcLEDs in an array to provide illumination adapted to the scene. Such data can be provided for example by an image sensor, or optical (e.g., laser scanning) or non-optical (e.g., millimeter radar) sensors. Such adaptive illumination is increasingly important for automotive (e.g., adaptive headlights), mobile device camera (e.g., adaptive flash), AR, VR, and MR applications such as those described below.

Figure 5:
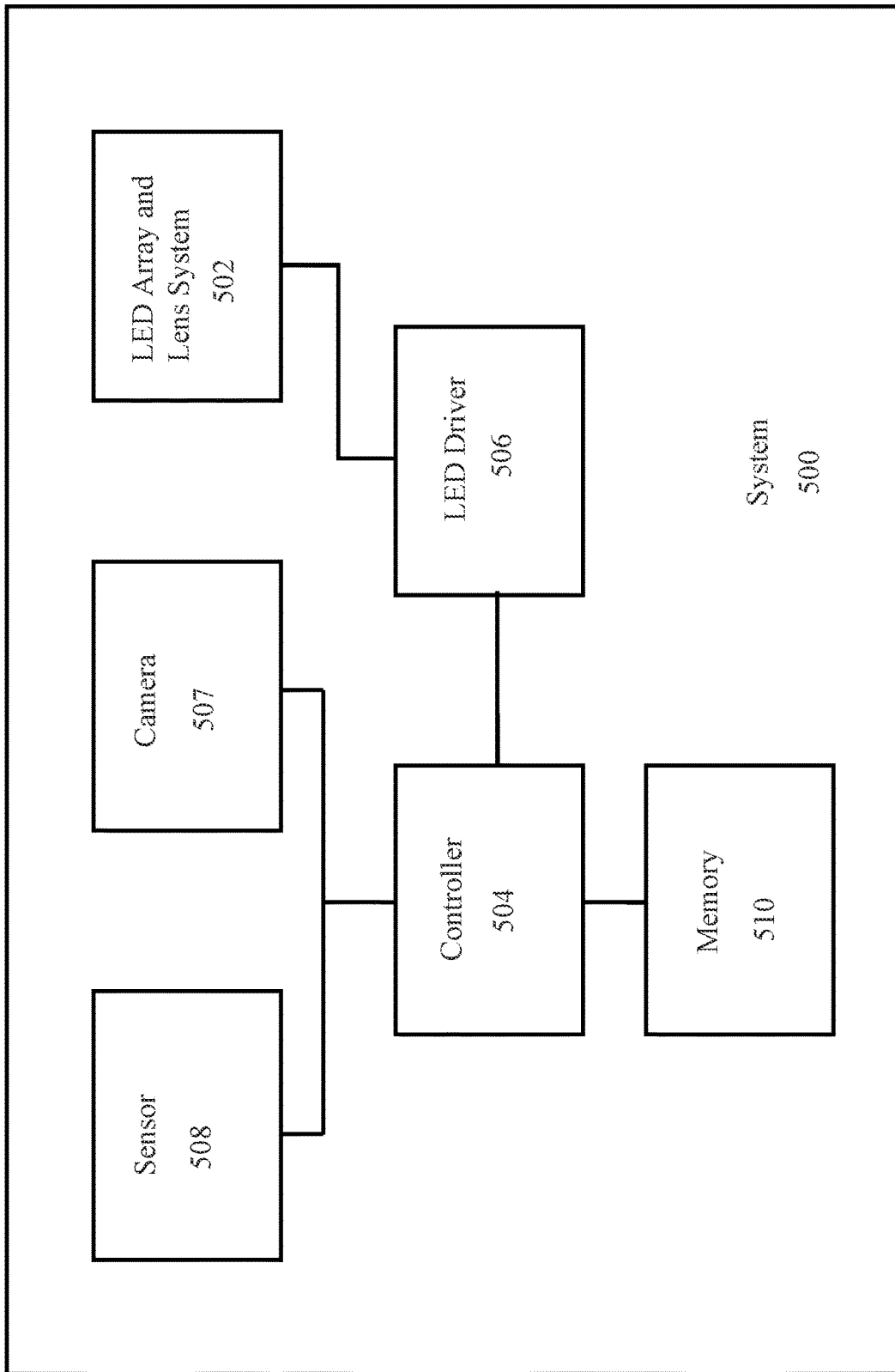
FIG. 5 schematically illustrates an example camera flash system.

FIG. 5 schematically illustrates an example camera flash system 500 comprising an LED or pcLED array and an optical (e.g., lens) system 502, which may be or comprise an adaptive lighting system as described above in which LEDs or pcLEDs in the array may be individually operable or operable as groups. In operation of the camera flash system, illumination from some or all of the LEDs or pcLEDs in array and optical system 502 may be adjusted—deactivated, operated at full intensity, or operated at an intermediate intensity. The array may be a monolithic array, or comprise one or more monolithic arrays, as described above. The array may be a microLED array, as described above.

Flash system 500 also comprises an LED driver 506 that is controlled by a controller 504, such as a microprocessor. Controller 504 may also be coupled to a camera 507 and to sensors 508 and operate in accordance with instructions and profiles stored in memory 510. Camera 507 and LED or pcLED array and lens system 502 may be controlled by controller 504 to, for example, match the illumination provided by system 502 (i.e., the field of view of the illumination system) to the field of view of camera 507, or to otherwise adapt the illumination provided by system 502 to the scene viewed by the camera as described above. Sensors 508 may include, for example, positional sensors (e.g., a gyroscope and/or accelerometer) and/or other sensors that may be used to determine the position and orientation of system 500.

Figure 6:
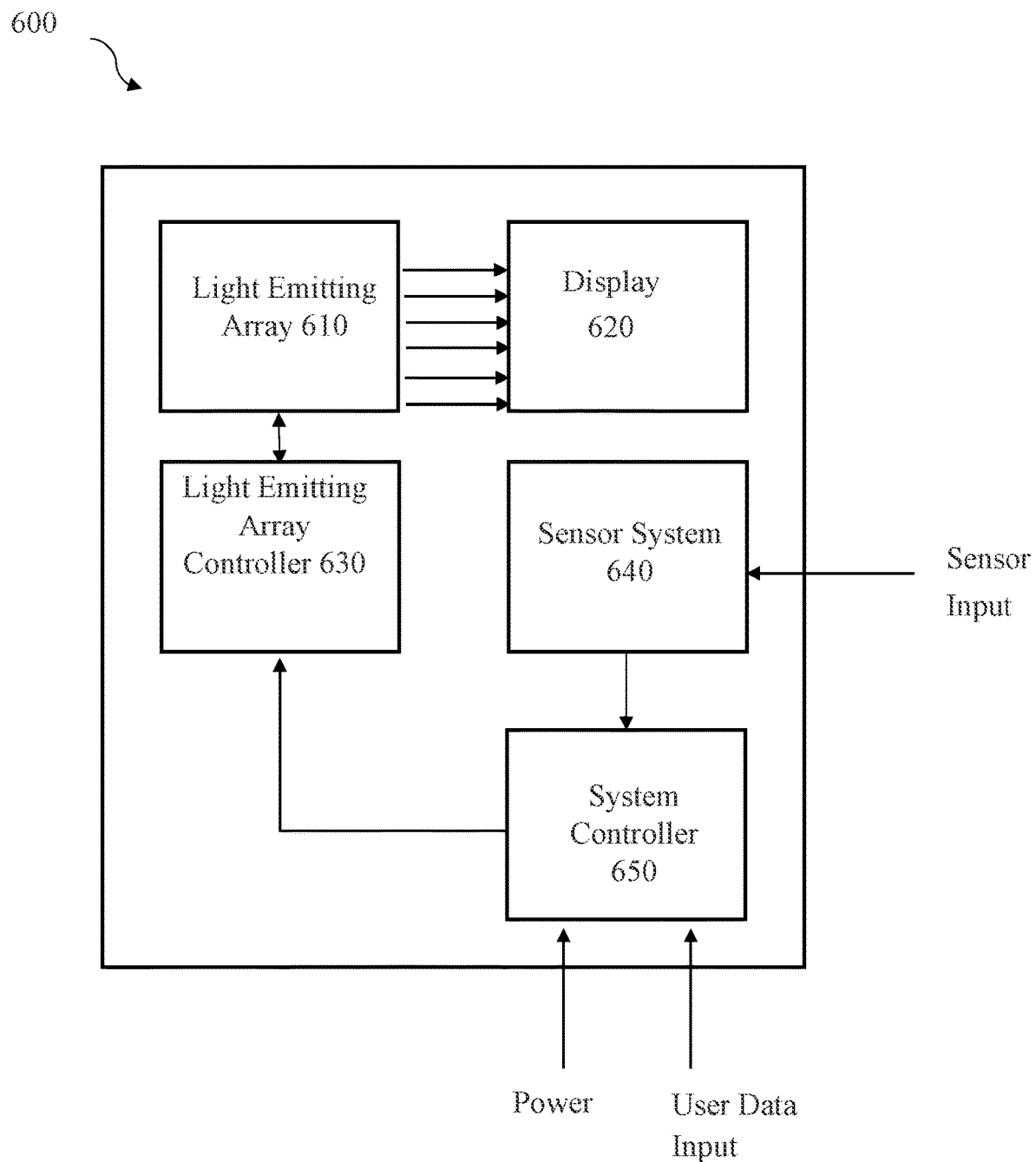
FIG. 6 schematically illustrates an example display system.

FIG. 6 schematically illustrates an example display system 600 that includes an array 610 of LEDs or pcLEDs that are individually operable or operable in groups, a display 620, a light emitting array controller 630, a sensor system 640, and a system controller 650. Array 610 may be a monolithic array, or comprise one or more monolithic arrays, as described above. The array may be monochromatic. Alternatively, the array may be a multicolor array in which different LEDs or pcLEDs in the array are configured to emit different colors of light, as described above. The array may therefore be or comprise a monolithic multicolor matrix of individually operable LED or pcLED light emitters, which may for example be microLEDs as described above. A single individually operable LED or pcLED or a group of adjacent such LEDs or pcLEDs in the array may correspond to a single pixel (picture element) in the display. For example, a group of three individually operable adjacent LEDs or pcLEDs comprising a red emitter, a blue emitter, and a green emitter may correspond to a single color-tunable pixel in the display. Similarly, to provide redundancy in the event of a defective LED or pcLED, a group of six individually operable adjacent LEDs or pcLEDs comprising two red emitters, two blue emitters, and two green emitters may correspond to a single color-tunable pixel in the display Array 610 can be used to project light in graphical or object patterns that can for example support AR/VR/MR systems.

Sensor input is provided to the sensor system 640, while power and user data input is provided to the system controller 650. In some embodiments modules included in system 600 can be compactly arranged in a single structure, or one or more elements can be separately mounted and connected via wireless or wired communication. For example, array 610, display 620, and sensor system 640 can be mounted on a headset or glasses, with the light emitting array controller and/or system controller 650 separately mounted.

System 600 can incorporate a wide range of optics (not shown) to couple light emitted by array 610 into display 620. Any suitable optics may be used for this purpose.

Sensor system 640 can include, for example, external sensors such as cameras, depth sensors, or audio sensors that monitor the environment, and internal sensors such as accelerometers or two or three axis gyroscopes that monitor an AR/VR/MR headset position. Other sensors can include but are not limited to air pressure, stress sensors, temperature sensors, or any other suitable sensors needed for local or remote environmental monitoring. In some embodiments, control input through the sensor system can include detected touch or taps, gestural input, or control based on headset or display position.

In response to data from sensor system 640, system controller 650 can send images or instructions to the light emitting array controller 630. Changes or modification to the images or instructions can also be made by user data input, or automated data input as needed. User data input can include but is not limited to that provided by audio instructions, haptic feedback, eye or pupil positioning, or connected keyboard, mouse, or game controller.

As noted above, AR, VR, and MR systems may be more generally referred to as examples of visualization systems. In a virtual reality system, a display can present to a user a view of a scene, such as a three-dimensional scene. The user can move within the scene, such as by repositioning the user's head or by walking. The virtual reality system can detect the user's movement and alter the view of the scene to account for the movement. For example, as a user rotates the user's head, the system can present views of the scene that vary in view directions to match the user's gaze. In this manner, the virtual reality system can simulate a user's presence in the three-dimensional scene. Further, a virtual reality system can receive tactile sensory input, such as from wearable position sensors, and can optionally provide tactile feedback to the user.

In an augmented reality system, the display can incorporate elements from the user's surroundings into the view of the scene. For example, the augmented reality system can add textual captions and/or visual elements to a view of the user's surroundings. For example, a retailer can use an augmented reality system to show a user what a piece of furniture would look like in a room of the user's home, by incorporating a visualization of the piece of furniture over a captured image of the user's surroundings. As the user moves around the user's room, the visualization accounts for the user's motion and alters the visualization of the furniture in a manner consistent with the motion. For example, the augmented reality system can position a virtual chair in a room. The user can stand in the room on a front side of the virtual chair location to view the front side of the chair. The user can move in the room to an area behind the virtual chair location to view a back side of the chair. In this manner, the augmented reality system can add elements to a dynamic view of the user's surroundings.

Figure 7:
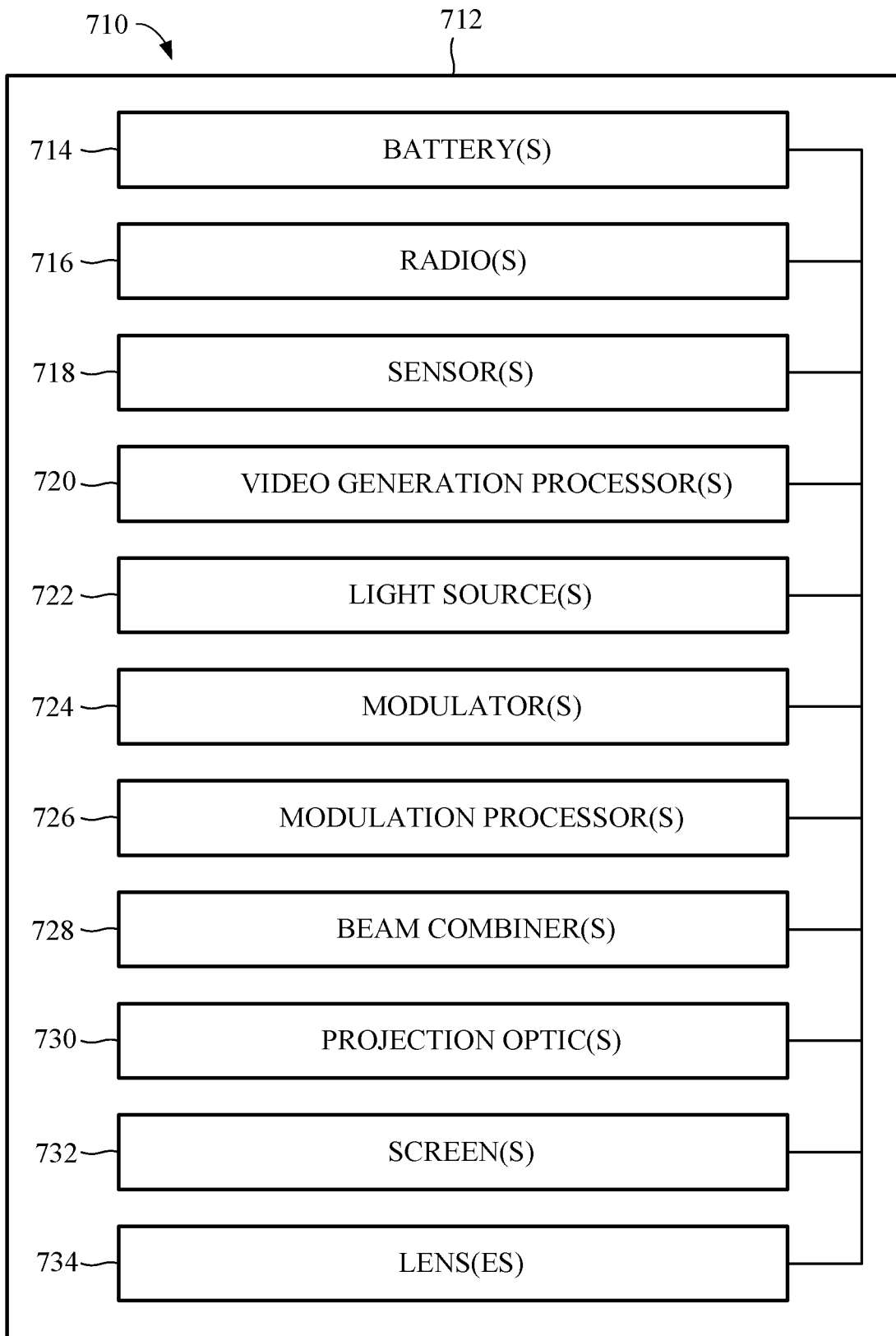
FIG. 7 shows a block diagram of an example visualization system.

FIG. 7 shows a generalized block diagram of an example visualization system 710. The visualization system 710 can include a wearable housing 712, such as a headset or goggles. The housing 712 can mechanically support and house the elements detailed below. In some examples, one or more of the elements detailed below can be included in one or more additional housings that can be separate from the wearable housing 712 and couplable to the wearable housing 712 wirelessly and/or via a wired connection. For example, a separate housing can reduce the weight of wearable goggles, such as by including batteries, radios, and other elements. The housing 712 can include one or more batteries 714, which can electrically power any or all of the elements detailed below. The housing 712 can include circuitry that can electrically couple to an external power supply, such as a wall outlet, to recharge the batteries 714. The housing 712 can include one or more radios 716 to communicate wirelessly with a server or network via a suitable protocol, such as WiFi.

The visualization system 710 can include one or more sensors 718, such as optical sensors, audio sensors, tactile sensors, thermal sensors, gyroscopic sensors, time-of-flight sensors, triangulation-based sensors, and others. In some examples, one or more of the sensors can sense a location, a position, and/or an orientation of a user. In some examples, one or more of the sensors 718 can produce a sensor signal in response to the sensed location, position, and/or orientation. The sensor signal can include sensor data that corresponds to a sensed location, position, and/or orientation. For example, the sensor data can include a depth map of the surroundings. In some examples, such as for an augmented reality system, one or more of the sensors 718 can capture a real-time video image of the surroundings proximate a user.

The visualization system 710 can include one or more video generation processors 720. The one or more video generation processors 720 can receive, from a server and/or a storage medium, scene data that represents a three-dimensional scene, such as a set of position coordinates for objects in the scene or a depth map of the scene. The one or more video generation processors 720 can receive one or more sensor signals from the one or more sensors 718. In response to the scene data, which represents the surroundings, and at least one sensor signal, which represents the location and/or orientation of the user with respect to the surroundings, the one or more video generation processors 720 can generate at least one video signal that corresponds to a view of the scene. In some examples, the one or more video generation processors 720 can generate two video signals, one for each eye of the user, that represent a view of the scene from a point of view of the left eye and the right eye of the user, respectively. In some examples, the one or more video generation processors 720 can generate more than two video signals and combine the video signals to provide one video signal for both eyes, two video signals for the two eyes, or other combinations.

The visualization system 710 can include one or more light sources 722 that can provide light for a display of the visualization system 710. Suitable light sources 722 can include any of the LEDs, pcLEDs, LED arrays, and pcLED arrays discussed above, for example those discussed above with respect to display system 600.

The visualization system 710 can include one or more modulators 724. The modulators 724 can be implemented in one of at least two configurations.

In a first configuration, the modulators 724 can include circuitry that can modulate the light sources 722 directly. For example, the light sources 722 can include an array of light-emitting diodes, and the modulators 724 can directly modulate the electrical power, electrical voltage, and/or electrical current directed to each light-emitting diode in the array to form modulated light. The modulation can be performed in an analog manner and/or a digital manner. In some examples, the light sources 722 can include an array of red light-emitting diodes, an array of green light-emitting diodes, and an array of blue light-emitting diodes, and the modulators 724 can directly modulate the red light-emitting diodes, the green light-emitting diodes, and the blue light-emitting diodes to form the modulated light to produce a specified image.

In a second configuration, the modulators 724 can include a modulation panel, such as a liquid crystal panel. The light sources 722 can produce uniform illumination, or nearly uniform illumination, to illuminate the modulation panel. The modulation panel can include pixels. Each pixel can selectively attenuate a respective portion of the modulation panel area in response to an electrical modulation signal to form the modulated light. In some examples, the modulators 724 can include multiple modulation panels that can modulate different colors of light. For example, the modulators 724 can include a red modulation panel that can attenuate red light from a red light source such as a red light-emitting diode, a green modulation panel that can attenuate green light from a green light source such as a green light-emitting diode, and a blue modulation panel that can attenuate blue light from a blue light source such as a blue light-emitting diode.

In some examples of the second configuration, the modulators 724 can receive uniform white light or nearly uniform white light from a white light source, such as a white-light light-emitting diode. The modulation panel can include wavelength-selective filters on each pixel of the modulation panel. The panel pixels can be arranged in groups (such as groups of three or four), where each group can form a pixel of a color image. For example, each group can include a panel pixel with a red color filter, a panel pixel with a green color filter, and a panel pixel with a blue color filter. Other suitable configurations can also be used.

The visualization system 710 can include one or more modulation processors 726, which can receive a video signal, such as from the one or more video generation processors 720, and, in response, can produce an electrical modulation signal. For configurations in which the modulators 724 directly modulate the light sources 722, the electrical modulation signal can drive the light sources 724. For configurations in which the modulators 724 include a modulation panel, the electrical modulation signal can drive the modulation panel.

The visualization system 710 can include one or more beam combiners 728 (also known as beam splitters 728), which can combine light beams of different colors to form a single multi-color beam. For configurations in which the light sources 722 can include multiple light-emitting diodes of different colors, the visualization system 710 can include one or more wavelength-sensitive (e.g., dichroic) beam splitters 728 that can combine the light of different colors to form a single multi-color beam.

The visualization system 710 can direct the modulated light toward the eyes of the viewer in one of at least two configurations. In a first configuration, the visualization system 710 can function as a projector, and can include suitable projection optics 730 that can project the modulated light onto one or more screens 732. The screens 732 can be located a suitable distance from an eye of the user. The visualization system 710 can optionally include one or more lenses 734 that can locate a virtual image of a screen 732 at a suitable distance from the eye, such as a close-focus distance, such as 500 mm, 750 mm, or another suitable distance. In some examples, the visualization system 710 can include a single screen 732, such that the modulated light can be directed toward both eyes of the user. In some examples, the visualization system 710 can include two screens 732, such that the modulated light from each screen 732 can be directed toward a respective eye of the user. In some examples, the visualization system 710 can include more than two screens 732. In a second configuration, the visualization system 710 can direct the modulated light directly into one or both eyes of a viewer. For example, the projection optics 730 can form an image on a retina of an eye of the user, or an image on each retina of the two eyes of the user.

For some configurations of augmented reality systems, the visualization system 710 can include an at least partially transparent display, such that a user can view the user's surroundings through the display. For such configurations, the augmented reality system can produce modulated light that corresponds to the augmentation of the surroundings, rather than the surroundings itself. For example, in the example of a retailer showing a chair, the augmented reality system can direct modulated light, corresponding to the chair but not the rest of the room, toward a screen or toward an eye of a user.

As summarized above, this specification discloses color tunable pcLEDs for which the output light beam is color tuned by temporal saturation of an electronic transition from which the phosphor light emission arises. Light emitting devices comprising such pcLEDs may comprise or be components of the apparatus and devices described above with respect to FIGS. 1-7. Methods disclosed in this specification for operation of such color tunable pcLEDs may be employed with the apparatus and devices described above with respect to FIGS. 1-7.

Generally, the excited energy state of an electronic transition is characterized by a relaxation time. For example, the relaxation times for the light emitting excited electronic states for phosphor materials YAG:Ce$^{3+}$, CASN: Eu$^{2+}$, KSF: Mn$^{4+}$ are 65 ns, 562 ns, 8.5 ms, respectively. Excitation of a phosphor material with one or more pulses of light having a full width at half maximum shorter than the phosphor's relaxation time and having a sufficiently high peak power can put the majority of the electrons in the excited state (i.e., deplete the ground electronic state) within the duration of the relaxation time. Any further increase in the pulse power or an additional pulse during the relaxation time will not be absorbed by the phosphor due to saturation of the absorption.

The amplitude, length, and spacing of the (e.g., blue) light pulses output from the LED into the phosphor component of the pcLED may be controlled, by modulating the drive current to the LED, to control saturation of the phosphor electronic transmission and to adjust the amount of light from the LED transmitted through the phosphor. The light output from the pcLED can be tuned to a desired color point and/or correlated color temperature by adjusting in this manner the amount of light from the LED transmitted through the phosphor.

This may be done while also maintaining a desired average incident power on the phosphor and/or a desired average output power from the pcLED. A desired average incident power on the phosphor may for example be an incident power that does not exceed the mild operation condition of the phosphor, which is the condition that thermal quenching of the phosphor is insignificant. For example, average incident power of blue light may be kept below 1 W/mm² for CASN: Eu²⁺ to stay within the mild operation condition.

Figure 8:
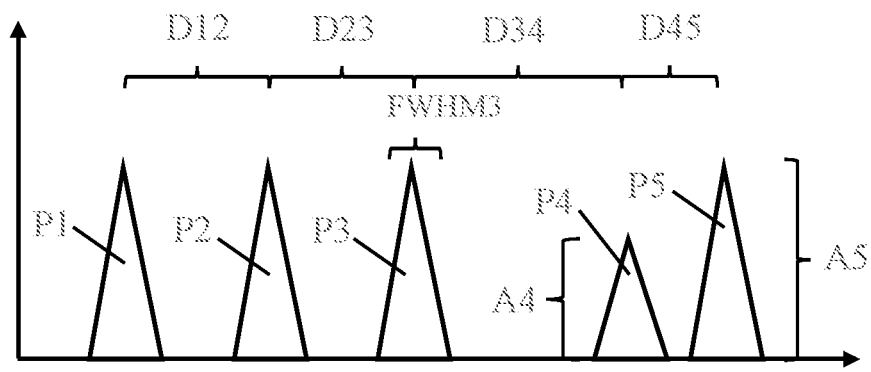
FIG. 8 schematically shows a portion of a pulse train emitted by an LED as employed in devices and methods as described herein.

FIG. 8 schematically shows a portion of a pulse train comprising example pulses P1, P2, P3, P4, and P5, separated from each other by pulse spacings D12, D23, D34, and D45, with the fullwidth at half maximum of pulse P3 labelled FWHM3, and with the amplitudes A4 and A5 of pulses P4 and P5 labelled.

In the methods and devices disclosed herein, any combination of the amplitudes, pulse spacings, and pulse full widths at half maximum may vary along the pulse train or be uniform along the pulse train. The pulse train may comprise pairs of pulses of different amplitudes (e.g., P4 and P5), with for example a first pulse (P5) having an amplitude and fullwidth at half maximum that saturates the electronic transition in the phosphor and the second pulse in the pair substantially transmitted through the saturated phosphor.

Figure 9A:
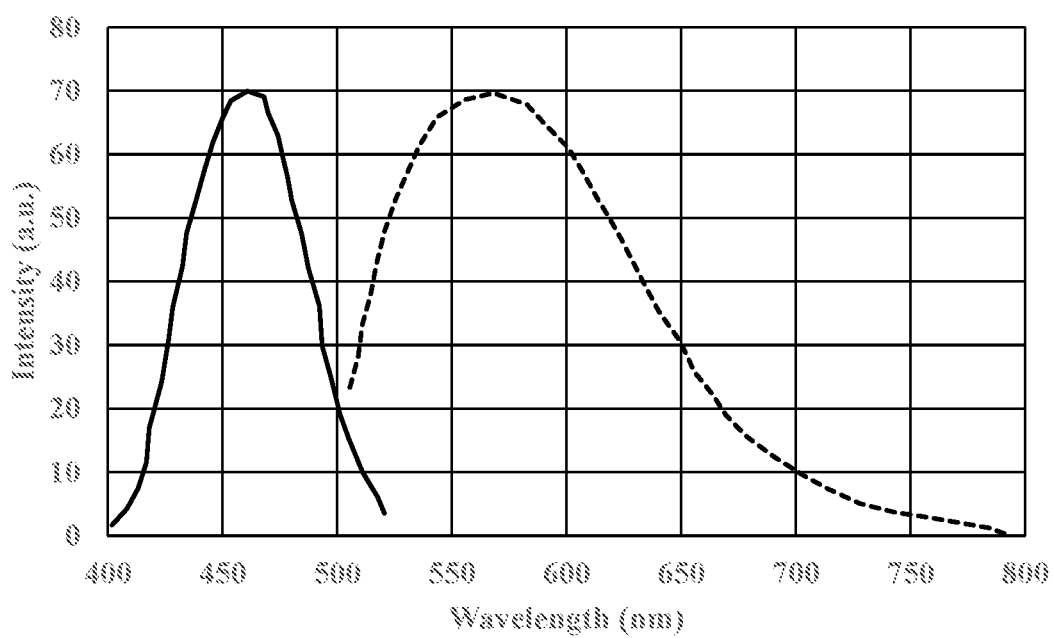
FIG. 9A shows the excitation and emission spectra of a typical phosphor.
Figure 9B:
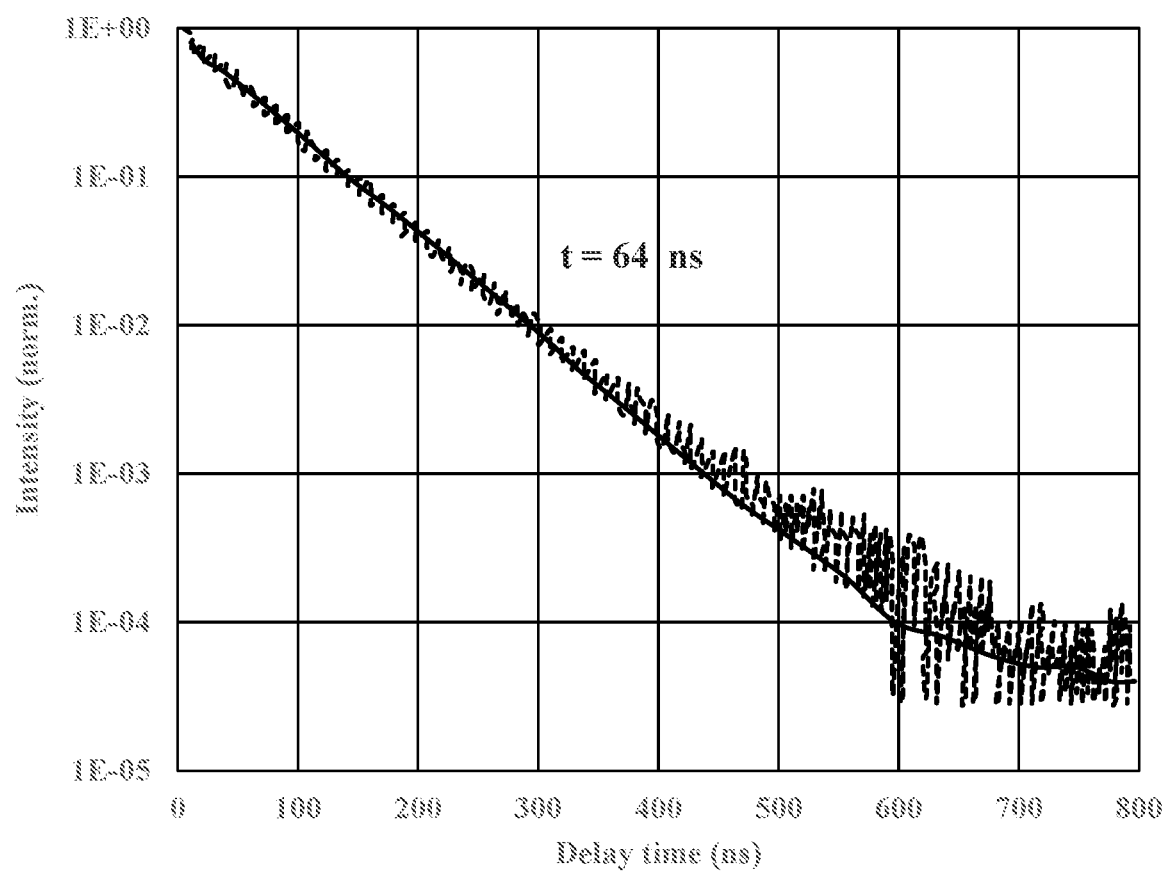
FIG. 9B shows a plot of measured luminescence intensity from the phosphor of FIG. 9A as a function of delay time after excitation, fit to an exponential decay.

FIG. 9A shows the excitation (solid line) and emission (dashed line) spectra of a typical phosphor such as YAG: Ce³⁺, and FIG. 9B shows a plot of measured luminescence intensity from this phosphor as a function of delay time after excitation fit to an exponential decay with a relaxation time of 64 nanoseconds. This phosphor may be saturated in the devices and methods disclosed herein with excitation pulses having a full width half maximum less than or equal to that relaxation time.

Figure 10:
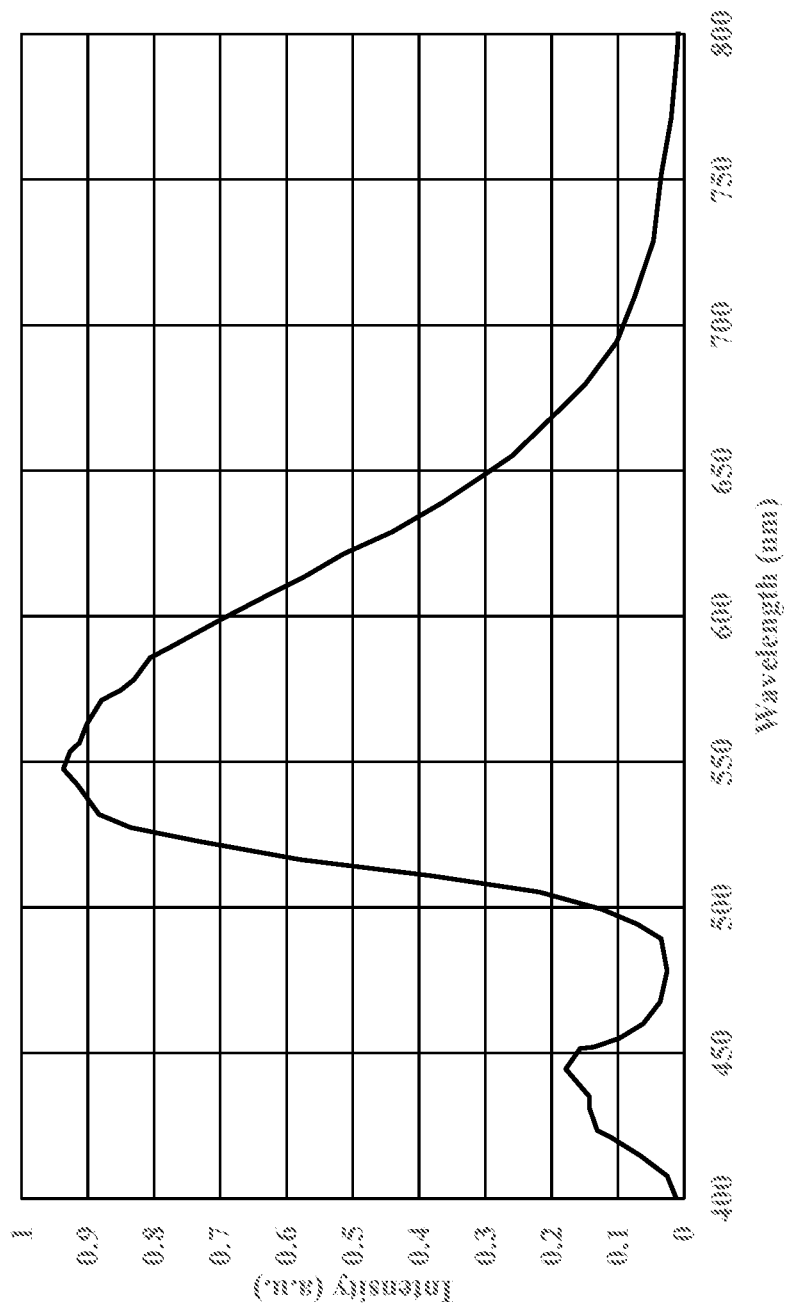
FIG. 10 shows an emission spectrum from an example pcLED comprising a blue light emitting semiconductor LED and a phosphor, with the LED driven to produce blue light pulses of long duration that do not saturate the phosphor.

FIG. 10 shows an emission spectrum from an example pcLED comprising a blue light emitting semiconductor LED and a YAG:Ce³⁺ phosphor, with the LED driven to produce blue light pulses of long duration that do not saturate the phosphor. The color temperature of the output is 3950K and the color point is u'=0.204, v'=0.551.

Figure 11:
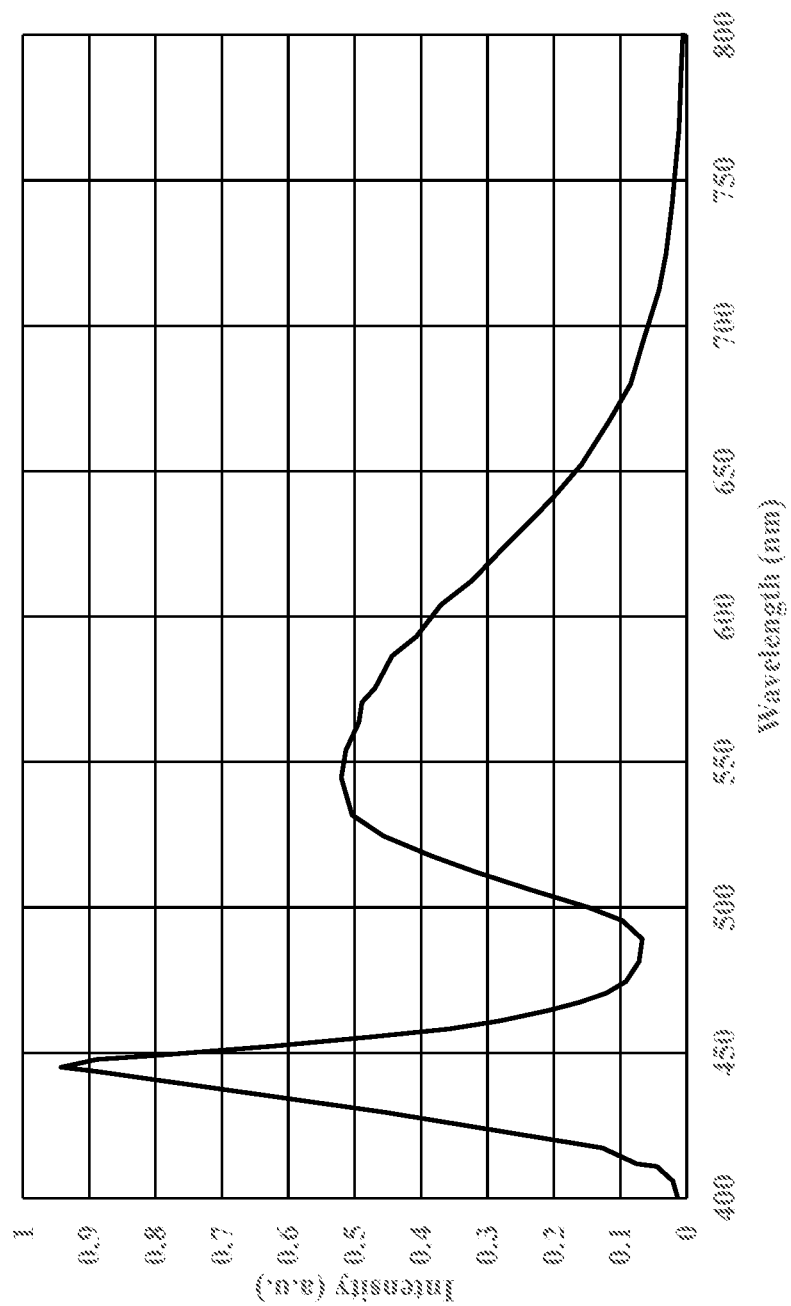
FIG. 11 shows an emission spectrum from the pcLED of FIG. 9, with the LED driven to produce blue light pulses of short duration that saturate the phosphor.

FIG. 11 shows an emission spectrum from the example pcLED of FIG. 9, with the LED driven to produce blue light pulses of short duration that saturate the phosphor. In the emission spectrum shown in FIG. 10, for which the phosphor is saturated by the short blue pulses, the ratio of the height of the 450 nm (blue LED emission) peak to the 560 nm (phosphor emission) peak is much larger than the corresponding ratio of peak heights for FIG. 9. The color temperature of the output is 6070K and the color point is u'=0.2008, v'=0.473.

Phosphor converted LEDs comprising a single phosphor that are operated as described herein to saturate the phosphor may be color tuned along a line in the color space. Phosphor converted LEDS comprising two or more phosphors that are operated herein to saturate only one of the phosphors may be tuned along a curve in color space. Phosphor converted LEDs comprising two or more phosphor that are operated as described herein to saturate two of the phosphors may be tuned within a triangle in color space. Phosphor converted LEDs comprising three or more saturable phosphors that are operated as described herein to saturate three of the phosphors may be tuned within a quadrangle in color space. Saturation of more than three phosphors would allow tuning in more complex areas in color space.

The following enumerated clauses provide additional non-limiting aspects of the disclosure.

1. A light emitting device comprising:
a semiconductor light emitting diode configured to emit a train of primary light pluses, each primary light pulse having a maximum amplitude and a temporal full width at half maximum, adjacent light pulses in the train separated in time from each other by a temporal pulse spacing;
a phosphor material arranged in an optical path for light emitted by the semiconductor light emitting diode and characterized by having an electronic transition that absorbs primary light emitted by the semiconductor light emitting diode and by emitting secondary light of a longer wavelength in response to absorbing the primary light, the phosphor material electronic transition characterized by a relaxation time; and
a controller configured to drive the semiconductor light emitting diode to emit the train of primary light pulses with their temporal full width at half maximum less than the phosphor material electronic transition relaxation time and with a combination of temporal full width at half maximum and maximum amplitude that saturates the phosphor material electronic transition.

2. The light emitting device of clause 1, wherein the light pulse temporal full width at half maximum is less than or equal to 30 nanoseconds, less than or equal to 20 nanoseconds, less than or equal to 10 nanoseconds, or less than or equal to 5 nanoseconds.

3. The light emitting device of clause 1, wherein the controller is configured to adjust the temporal full width at half maximum, the maximum amplitude, the temporal pulse spacing, or any combination thereof to adjust an amount of primary light transmitted unabsorbed through the phosphor material.

4. The light emitting device of clause 1, wherein:
the light emitting device emits white light characterized by a correlated color temperature; and
the controller is configured to adjust the temporal full width at half maximum, the maximum amplitude, the temporal pulse spacing, or any combination thereof to adjust the correlated color temperature by adjusting an amount of primary light transmitted unabsorbed through the phosphor material.

5. The light emitting device of clause 1, wherein:
the light emitting device emits light characterized by a color point x,y in a CIE 1931 chromaticity diagram; and
the controller is configured to adjust the temporal full width at half maximum, the maximum amplitude, the temporal pulse spacing, or any combination thereof to adjust the color point by adjusting an amount of primary light transmitted unabsorbed through the phosphor material.

6. The light emitting device of any of clauses 1-5, wherein the primary light is blue light.

7. The light emitting device of any of clauses 1-6, wherein the phosphor material electronic transition relaxation time is less than or equal to 10 milliseconds.

8. The light emitting device of clause 7, wherein the phosphor material electronic transition relaxation time is less than or equal to 1 millisecond.

9. The light emitting device of clause 8, wherein the phosphor material electronic transition relaxation time is less than or equal to 0.1 millisecond.

10. The light emitting device of any of clauses 1-9, wherein the phosphor material is or comprises YAG: Ce³⁺.

11. The light emitting device of any of clauses 1-9, wherein the phosphor material is or comprises CASN: Eu²⁺.

12. The light emitting device of any of clauses 1-9, wherein the phosphor material is or comprises KSF:Mn$^{4+}$.
13. The light emitting device of clause 1, wherein:
the primary light is blue light;
the phosphor material is YAG:Ce$^{3+}$; and
the controller is configured to adjust the temporal full width at half maximum, the maximum amplitude, the temporal pulse spacing, or any combination thereof to adjust correlated color temperature between 3950K and 6070K.
14. An illumination system comprising:
a plurality of light emitting devices of any of clauses 1-13 arranged in an array; and
an optic or optical system arranged to image the array to form an output illumination beam.
15. The illumination system of clause 14, wherein at least some of the light emitting devices are independently operable to steer a direction of the output illumination beam.
16. A display system comprising:
a light source comprising a plurality of the light emitting devices of any of clauses 1-13 arranged in an array;
a display; and
an optic or optical system arranged to couple light from the light source into the display.
17. A mobile device comprising:
a camera;
a flash illumination system comprising a light source comprising a plurality of the light emitting devices of any of clauses 1-13 arranged in an array and an optic or optical system arranged to at least partially collimate light emitted by the light source; and
a controller configured to operate the light emitting devices to match a field of view of the flash illumination system to a field of view of the camera.
18. A method of operating a light emitting device,
the light emitting device comprising
a semiconductor light emitting diode configured to emit a train of primary light pluses, each primary light pulse having a maximum amplitude and a temporal full width at half maximum amplitude, adjacent light pulses in the train separated in time from each other by a temporal pulse spacing; and
a phosphor material arranged in an optical path for light emitted by the semiconductor light emitting diode and characterized by having an electronic transition that absorbs primary light emitted by the semiconductor light emitting diode and by emitting secondary light of a longer wavelength in response to absorbing the blue light, the phosphor material electronic transition characterized by a relaxation time;
the method comprising driving the semiconductor light emitting diode to emit the train of primary light pulses with their temporal full width at half maximum less than the phosphor material electronic transition relaxation time and with a combination of temporal full width at half maximum, maximum amplitude, temporal pulse spacing, or any combination thereof selected to adjust primary light transmitted unabsorbed through the phosphor material to a desired amount.
19. The method of clause 18, wherein the light emitting device emits an output beam of white light characterized by a correlated color temperature, comprising driving the semiconductor light emitting diode to emit the train of primary light pulses with a combination of temporal full width at half maximum, maximum amplitude, temporal pulse spacing, or any combination thereof selected to adjust the correlated color temperature to a desired value.
20 The method of clause 18, wherein the light emitting device emits an output beam of light characterized by a color point x,y in a CIE 1931 chromaticity diagram, comprising driving the semiconductor light emitting diode to emit the train of primary light pulses with a combination of temporal full width at half maximum, maximum amplitude, temporal pulse spacing, or any combination thereof selected to adjust the color point to a desired value.

This disclosure is illustrative and not limiting. Further modifications will be apparent to one skilled in the art in light of this disclosure and are intended to fall within the scope of the appended claims.

What is claimed is:
1. A light emitting device comprising:
a semiconductor light emitting diode configured to emit a train of primary light pulses, each primary light pulse having a maximum amplitude and a temporal full width at half maximum, adjacent light pulses in the train separated in time from each other by a temporal pulse spacing;
a phosphor material arranged in an optical path for light emitted by the semiconductor light emitting diode and characterized by having an electronic transition that absorbs primary light emitted by the semiconductor light emitting diode and by emitting secondary light of a longer wavelength in response to absorbing the primary light, the phosphor material electronic transition characterized by a relaxation time; and
a controller configured to drive the semiconductor light emitting diode to emit the train of primary light pulses with their temporal full width at half maximum less than the phosphor material electronic transition relaxation time and with a combination of temporal full width at half maximum and maximum amplitude that saturates the phosphor material electronic transition.
2. The light emitting device of claim 1, wherein the light pulse temporal full width at half maximum is less than or equal to 30 nanoseconds, less than or equal to 20 nanoseconds, less than or equal to 10 nanoseconds, or less than or equal to 5 nanoseconds.
3. The light emitting device of claim 1, wherein the controller is configured to adjust the temporal full width at half maximum, the maximum amplitude, the temporal pulse spacing, or any combination thereof to adjust an amount of primary light transmitted unabsorbed through the phosphor material.
4. The light emitting device of claim 1, wherein:
the light emitting device emits white light characterized by a correlated color temperature; and
the controller is configured to adjust the temporal full width at half maximum, the maximum amplitude, the temporal pulse spacing, or any combination thereof to adjust the correlated color temperature by adjusting an amount of primary light transmitted unabsorbed through the phosphor material.
5. The light emitting device of claim 1, wherein:
the light emitting device emits light characterized by a color point x,y in a CIE 1931 chromaticity diagram; and
the controller is configured to adjust the temporal full width at half maximum, the maximum amplitude, the temporal pulse spacing, or any combination thereof to adjust the color point by adjusting an amount of primary light transmitted unabsorbed through the phosphor material.

6. The light emitting device of claim 1, wherein the primary light is blue light.

7. The light emitting device of claim 1, wherein the phosphor material electronic transition relaxation time is less than or equal to 10 milliseconds.

8. The light emitting device of claim 7, wherein the phosphor material electronic transition relaxation time is less than or equal to 1 millisecond.

9. The light emitting device of claim 8, wherein the phosphor material electronic transition relaxation time is less than or equal to 0.1 millisecond.

10. The light emitting device of claim 1, wherein the phosphor material is or comprises YAG:Ce$^{3+}$.

11. The light emitting device of claim 1, wherein the phosphor material is or comprises CASN:Eu$^{2+}$.

12. The light emitting device of claim 1, wherein the phosphor material is or comprises KSF:Mn$^{4+}$.

13. The light emitting device of claim 1, wherein:
the primary light is blue light;
the phosphor material is YAG:Ce$^{3+}$; and
the controller is configured to adjust the temporal full width at half maximum, the maximum amplitude, the temporal pulse spacing, or any combination thereof to adjust correlated color temperature between 3950 K and 6070 K.

14. An illumination system comprising:
a plurality of light emitting devices of claim 1 arranged in an array; and
an optic or optical system arranged to image the array to form an output illumination beam.

15. The illumination system of claim 14, wherein at least some of the light emitting devices are independently operable to steer a direction of the output illumination beam.

16. A display system comprising:
a light source comprising a plurality of the light emitting devices of claim 1 arranged in an array;
a display; and
an optic or optical system arranged to couple light from the light source into the display.

17. A mobile device comprising:
a camera;
a flash illumination system comprising a light source comprising a plurality of the light emitting devices of claim 1 arranged in an array and an optic or optical system arranged to at least partially collimate light emitted by the light source; and
a controller configured to operate the light emitting devices to match a field of view of the flash illumination system to a field of view of the camera.

18. A method of operating a light emitting device,
the light emitting device comprising
a semiconductor light emitting diode configured to emit a train of primary light pulses, each primary light pulse having a maximum amplitude and a temporal full width at half maximum amplitude, adjacent light pulses in the train separated in time from each other by a temporal pulse spacing; and
a phosphor material arranged in an optical path for light emitted by the semiconductor light emitting diode and characterized by having an electronic transition that absorbs primary light emitted by the semiconductor light emitting diode and by emitting secondary light of a longer wavelength in response to absorbing the blue light, the phosphor material electronic transition characterized by a relaxation time;
the method comprising driving the semiconductor light emitting diode to emit the train of primary light pulses with their temporal full width at half maximum less than the phosphor material electronic transition relaxation time and with a combination of temporal full width at half maximum, maximum amplitude, temporal pulse spacing, or any combination thereof selected to adjust primary light transmitted unabsorbed through the phosphor material to a desired amount.

19. The method of claim 18, wherein the light emitting device emits an output beam of white light characterized by a correlated color temperature, comprising driving the semiconductor light emitting diode to emit the train of primary light pulses with a combination of temporal full width at half maximum, maximum amplitude, temporal pulse spacing, or any combination thereof selected to adjust the correlated color temperature to a desired value.

20. The method of claim 18, wherein the light emitting device emits an output beam of light characterized by a color point x,y in a CIE 1931 chromaticity diagram, comprising driving the semiconductor light emitting diode to emit the train of primary light pulses with a combination of temporal full width at half maximum, maximum amplitude, temporal pulse spacing, or any combination thereof selected to adjust the color point to a desired value.

* * * * *